(12) United States Patent
Sato (10) Patent No.: US 9,053,548 B2
(45) Date of Patent: Jun. 9, 2015

(54) LITHOGRAPHY APPARATUS INCLUDING DISPLAY UNIT FOR UPDATING DATA AND ARTICLE MANUFACTURING METHOD USING SAME

(71) Applicant: CANON KABUSHIKI KAISHA, Tokyo (JP)

(72) Inventor: Chiaki Sato, Utsunomiya (JP)

(73) Assignee: CANON KABUSHIKI KAISHA (JP)

( * ) Notice: Subject to any disclaimer, the term of this patent is extended or adjusted under 35 U.S.C. 154(b) by 0 days.

(21) Appl. No.: 13/958,788

(22) Filed: Aug. 5, 2013

(65) Prior Publication Data

US 2014/0065548 A1 Mar. 6, 2014

(30) Foreign Application Priority Data

Aug. 29, 2012 (JP) ................................. 2012-188624

(51) Int. Cl.
| | |
|---|---|
| *A61N 5/00* | (2006.01) |
| *G06T 5/00* | (2006.01) |
| *G06T 11/60* | (2006.01) |
| *H01J 37/317* | (2006.01) |
| *B82Y 10/00* | (2011.01) |
| *B82Y 40/00* | (2011.01) |

(52) U.S. Cl.
CPC ................. *G06T 5/006* (2013.01); *G06T 11/60* (2013.01); *H01J 37/3177* (2013.01); *H01J 2237/31771* (2013.01); *B82Y 10/00* (2013.01); *B82Y 40/00* (2013.01)

(58) Field of Classification Search
CPC ......... G03F 7/00; G03F 7/0005; G03F 7/001; G03F 7/0022; G03F 7/213; G03F 7/0383; G03F 7/704; G03F 7/70425; G03F 7/70616; G03F 7/70625; G03F 7/70633
USPC .................... 250/492.1, 492.2, 492.22, 492.3
See application file for complete search history.

(56) References Cited

U.S. PATENT DOCUMENTS

| | | | |
|---|---|---|---|
| 2001/0053964 A1* | 12/2001 | Kamon | 703/2 |
| 2005/0036175 A1* | 2/2005 | Klatchko et al. | 358/3.21 |
| 2005/0285054 A1* | 12/2005 | Inoue et al. | 250/492.22 |
| 2006/0134532 A1* | 6/2006 | Ogawa et al. | 430/5 |
| 2012/0229786 A1* | 9/2012 | Engelen et al. | 355/67 |
| 2012/0286173 A1* | 11/2012 | Van De Peut et al. | 250/492.1 |

FOREIGN PATENT DOCUMENTS

JP 2005-079112 A 3/2005

* cited by examiner

*Primary Examiner* — Nicole Ippolito
*Assistant Examiner* — Jason McCormack
(74) *Attorney, Agent, or Firm* — Rossi, Kimms & McDowell LLP (57) ABSTRACT

A lithography apparatus converts vector pattern data into bitmap data and performs writing on a substrate with a charged particle beam based on the bitmap data. Here, the lithography apparatus includes a display unit and a processing unit that causes the display unit to display an image corresponding to the bitmap data and performs processing for updating the bitmap data by changing at least one of a pixel value, dimension, and shape of the image displayed on the display unit via a graphical user interface.

11 Claims, 10 Drawing Sheets

LITHOGRAPHY APPARATUS INCLUDING DISPLAY UNIT FOR UPDATING DATA AND ARTICLE MANUFACTURING METHOD USING SAME

BACKGROUND OF THE INVENTION

1. Field of the Invention

The present invention relates to a lithography apparatus that performs writing on a substrate with a charged particle beam, and an article manufacturing method using the same.

2. Description of the Related Art

Lithography apparatuses that perform writing on a substrate by controlling deflection scanning and blanking of charged particle beams such as electron beams are known. The lithography apparatuses may be employed as one of pattern forming technologies that is an alternative to optical exposure systems for the production or the like of a memory device of 4GDRAM or later with a line width of 0.1 µm or less. As an example of such a lithography apparatus, there is also known a multiple-beam type lithography apparatus that performs writing using a plurality of charged particle beams in order to achieve improvements in throughput. Such a lithography apparatus converts writing data, i.e., obtained vector pattern data (pattern data which is a collection of rectangular or trapezoids) into bitmap data so as to perform writing based on the converted bitmap data. Here, the written pattern (writing result) may not be formed in a desired shape due to forward scattering or backscattering of electron beams during writing processing. Thus, the initially set pattern data is subject to proximity effect correction processing such as changes in writing distribution by emphasizing the corners of pattern graphics, dividing pattern graphics, or the like in advance. When an assumption is made that the entire pattern data is corrected with respect to a subject to be processed, the correction processing may take several hours at present. The pattern data (corrected data) subjected to correction processing is stored after the pattern data has been validated by simulation. The lithography apparatus receives the corrected data and converts it into bitmap data to thereby perform conversion of the position or magnification of the data. Then, the lithography apparatus further converts the corrected data into binary data corresponding to ON/OFF of writing to be transmitted to a blanking deflector to thereby finally perform writing. Japanese Patent Laid-Open No. 2005-79112 discloses an electron beam writing data editing method that is associated with proximity effect correction processing and extracts a part of micro graphics included in writing data as the editing target to thereby reflect it to original writing data after editing in order to improve correction accuracy.

However, even when pattern data is subject to the proximity effect correction processing as disclosed in Japanese Patent Laid-Open No. 2005-79112, the writing result may not be as desired because the writing result includes error factors of proximity effect correction due to changes in a material such as a resist, an antireflection film, or the like, processing for coating/development a resist, or the like. When the actual writing result is not as desired, the process needs to return to initial pattern data to re-edit pattern graphics. In other words, in this case, proximity effect correction processing or data conversion processing need to be repeated in accordance with changes in initial pattern data, resulting in an increase in data transfer time or writing processing time for bitmapping.

SUMMARY OF THE INVENTION

The present invention provides a lithography apparatus that is advantageous for readily performing proximity effect correction without the intermediary of changes in obtained vector pattern data.

According to an aspect of the present invention, a lithography apparatus that converts vector pattern data into bitmap data and performs writing on a substrate with a charged particle beam based on the bitmap data is provided that includes a display unit; and a processing unit that causes the display unit to display an image corresponding to the bitmap data and performs processing for updating the bitmap data by changing at least one of a pixel value, dimension, and shape of the image displayed on the display unit via a graphical user interface.

According to the present invention, a lithography apparatus that is advantageous for readily performing proximity effect correction without the intermediary of changes in obtained vector pattern data may be provided.

Further features of the present invention will become apparent from the following description of exemplary embodiments with reference to the attached drawings.

DESCRIPTION OF THE EMBODIMENTS

Hereinafter, preferred embodiments of the present invention will be described with reference to the drawings.

(First Embodiment)

Figure 1:
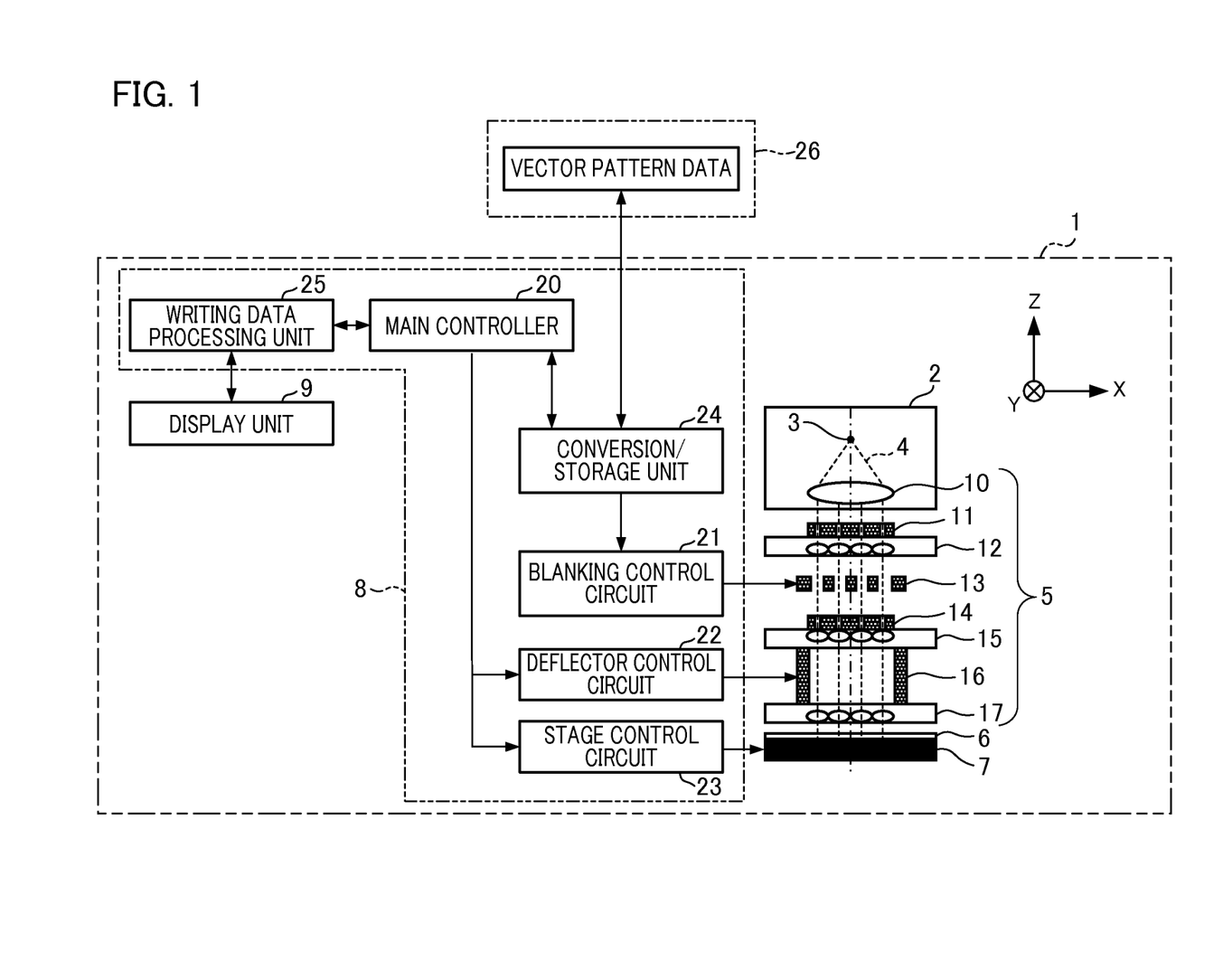
FIG. 1 is a diagram illustrating a configuration of a lithography apparatus according to a first embodiment of the present invention.

Firstly, a description will be given of a lithography apparatus according to a first embodiment of the present invention. The lithography apparatus of the present embodiment is a multi-beam type lithography apparatus that writes a predetermined pattern at a predetermined position on a wafer (substrate) by deflecting a plurality of electron beams (charged particle beams) and by independently controlling the blanking (OFF irradiation) of the electron beams. Here, a charged particle beam is not limited to an electron beam used in the present embodiment, but may be other charged particle beams such as an ion beam. Furthermore, a lithography apparatus is not limited to a multi-beam type lithography apparatus but may also be a single electron-beam type lithography apparatus. FIG. 1 is a schematic diagram illustrating a configuration of a lithography apparatus 1 according to the present embodiment. In FIG. 1, a description will be given in which the Z axis is in an irradiation direction nominal to an electron beam to a wafer, and the X axis and the Y axis are mutually oriented in directions orthogonal to a plane perpendicular to the Z axis. Furthermore, in the following drawings, the same elements as those shown in FIG. 1 are designated by the same reference numerals. The lithography apparatus 1 includes an electron gun 2, an optical system 5 that splits an electron beam 4 emitted from a crossover 3 of the electron gun 2 into a plurality of electron beams, and deflects and focuses the plurality of electron beams, a substrate stage 7 that holds a wafer 6, a controller 8 that controls the operation of the components of the lithography apparatus 1, and a display unit 9. Since the electron beam 4 is readily attenuated under an atmosphere at normal pressure or in order to prevent discharged under high voltage, the components such as the electron gun 2, the optical system 5, or the like are installed in the interior of a vacuum vessel (not shown) of which the internal pressure is adjusted by a vacuum exhaust system. Also, the wafer (substrate) 6 is a subject to be processed consisting, for example, of single crystal silicon, and a photosensitive resist (photosensitive agent) is coated on the surface thereof.

The electron gun 2 emits electrons (the electron beams 4) by applying heat or electric field. In FIG. 1, tracks of the electron beams 4 emitted from the crossover 3 are shown by dotted lines. In order from the electron gun 2, the optical system 5 firstly includes a collimator lens 10, an aperture array 11, a first electrostatic lens array 12, a blanking deflector array 13, and a stopping aperture array 14. Furthermore, the optical system 5 includes a second electrostatic lens array 15, a deflector array 16, and a third electrostatic lens array 17 at the downstream side. Firstly, the collimator lens 10 is an electron lens that focuses (collimates) the electron beam 4 emitted from the crossover 3 into an area beam having a desired size. The aperture array 11 has a plurality of circular openings which are arranged in matrix, and divides the electron beam 4 incident from the collimator lens 10 into a plurality of light components. The first electrostatic lens array 12 is an electron lens that is constituted by three electrode plates each having a plurality of circular openings which are arranged in matrix and focuses the electron beam 4 to the stopping aperture array 14. The blanking deflector array 13 and the stopping aperture array 14 perform the ON (non-blanking state)/OFF (blanking state) operation of the irradiation of the electron beam 4. In particular, the blanking deflector array 13 has a plurality of blanking deflectors (blankers) which are arranged in matrix, and can independently shield the electron beam 4. Also, the stopping aperture array 14 is arranged at a position at which the first electrostatic lens array 12 first forms the crossover of the electron beam 4. The deflector array 16 (or one including a single deflector) deflects (scans) an electron beam in the X-axis direction on the surface of the wafer 6 mounted on the substrate stage 7. Furthermore, as in the first electrostatic lens array 12, each of the second electrostatic lens array 15 and the third electrostatic lens array 17 is an electron lens that is constituted by three electrode plates and focuses the electron beam 4, which has passed through the stopping aperture array 14, onto the wafer 6. Furthermore, the substrate stage 7 is movable at least in the XY-axis direction while holding the wafer 6 by, for example, an electrostatic force, and the position of the substrate stage 7 is measured by an interferometer (laser length measuring device) (not shown) or the like in real time.

The controller 8 includes a main controller 20, a blanking control circuit 21, a deflector control circuit 22, a stage control circuit 23, a conversion/storage unit 24, and a writing data processing unit 25. The main controller 20 is connected to the components (control circuits) of the lithography apparatus 1 via a line to integrally control the components. The blanking control circuit (control unit) 21 individually controls a plurality of blanking deflectors included in the blanking deflector array 13 based on bitmap data as final writing data. The deflector control circuit 22 individually controls a plurality of deflectors included in the deflector array 16. The stage control circuit 23 controls the positioning of the substrate stage 7 with reference to position measurement by a laser interferometer. The conversion/storage unit 24 receives vector pattern data subjected to proximity effect correction processing from a correction/storage unit 26 which is provided on the exterior of the lithography apparatus (e.g., external storage device), executes conversion processing such as writing processing for bitmapping or the like, and stores data subjected to processing. The bitmap data, which is stored in the conversion/storage unit 24, subjected to conversion processing is transmitted to the blanking control circuit 21 in accordance with the instruction given by the main controller 20. The main controller 20 transmits bitmap data to the blanking control circuit 21 and transmits various types of position information to the deflector control circuit 22 and the stage control circuit 23 to thereby perform writing processing. The writing data processing unit (processing unit) 25 executes management of wafer information, management of the entire sequence of the lithography apparatus 1, management of writing recipe information, monitoring of the operation state of the lithography apparatus 1, and the like.

The display unit 9 displays an image corresponding to bitmap data stored in the conversion/storage unit 24 via the main controller 20. Furthermore, the display unit 9 has a graphical user interface function such as a touch panel function. When an image being displayed on the display unit 9 is changed, the display unit 9 transmits the changed information to the writing data processing unit 25. Hereinafter, a description will be given based on the assumption that the display unit 9 is installed on the lithography apparatus 1 itself. However, for example, a tablet type terminal device having a touch panel function may also be provided so as to establish wireless communication with the writing data processing unit 25. Note that the editing screen on the display unit 9 and the operation performed on the editing screen will be described below.

Figure 2:
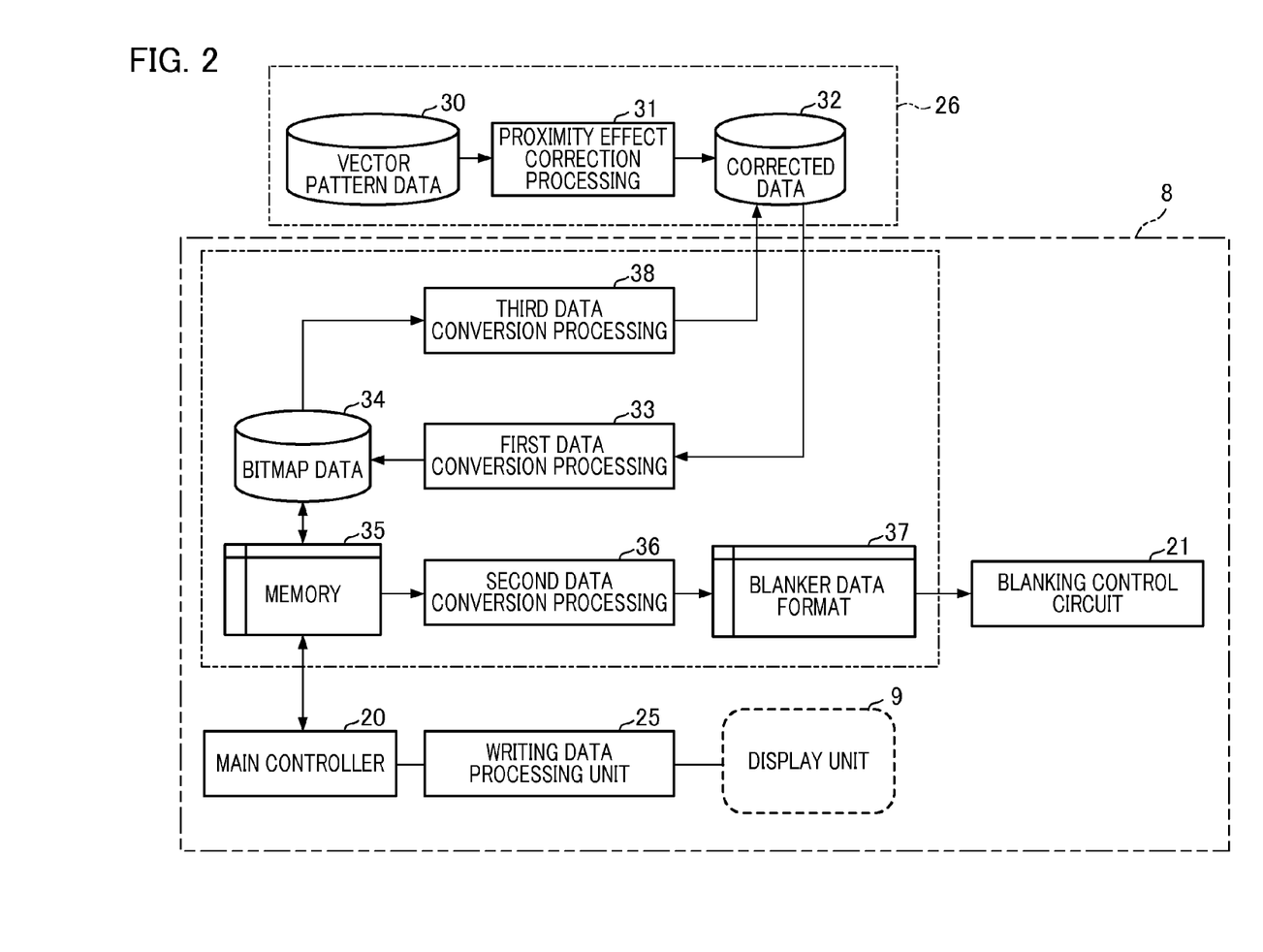
FIG. 2 is a block diagram illustrating the flow of generating writing data.
Figure 3:
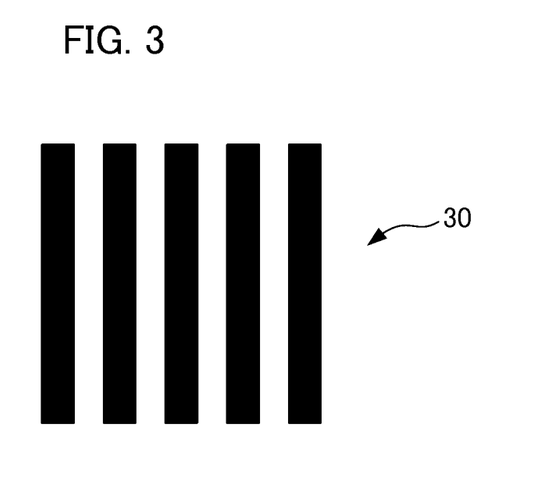
FIG. 3 is a diagram illustrating an example of vector pattern data assumed in the first embodiment.

Next, a description will be given of the flow of generating (converting and correcting) writing data in the lithography apparatus 1. FIG. 2 is a block diagram illustrating the flow of generating writing data. When the lithography apparatus 1 performs writing circuit pattern on the wafer 6 during manufacturing of the semiconductor device, a design pattern for writing a desired circuit pattern is stored as a vector pattern data (hereinafter referred to as "pattern data") 30 in the external correction/storage unit 26. The pattern data 30 is in a format represented by polygon or a collection of data of rectangulars or trapezoids, and is prepared for each device chip or for each writing step. FIG. 3 is a diagram illustrating an exemplary pattern data 30 to be applied to the present embodiment. The conversion/storage unit 24 provided in the lithography apparatus 1 acquires such pattern data as writing data and then converts it into bitmap data to thereby obtain a command value for the blanking deflector array 13. It should be noted that the lithography apparatus 1 does not necessarily generate a command value for the blanking control circuit 21 by using the initially set pattern data 30 as it is. This is because, if the pattern data 30 is used as it is, the proximity effect in which the circuit pattern written on the wafer 6 is not formed in a desired shape may occur due to forward scattering or backscattering of the electron beam 4 during writing processing. A specific example of the proximity effect is a phenomenon in which a partial excess or deficiency of dose occurs due to the difference in pattern density and thus an isolated portion or an edge portion of a circuit becomes thin. Hence, the initially set pattern data 30 is subject to proximity effect correction processing 31 such as changes in writing distribution by emphasizing the corners of pattern graphics or dividing pattern graphics by the correction/storage unit 26 before the initially set pattern data 30 is transmitted to the lithography apparatus 1. Correction processing to be performed in the proximity effect correction processing 31 is performed by the following two methods. The first method is to deform pattern graphics as in optical proximity effect correction (OPC). More specifically, the first method is a correction method based on rules (based on graphic computation), based on models (based on the graphical convolution by representing the effect of forward scattering or backscattering by formula), and the like. Furthermore, the second method is to change dose distribution incident on a wafer by dividing pattern graphics into plural components. At this point, a pattern data (hereinafter referred to as "corrected data") 32 subjected to such correction remains in a vector format.

Next, the conversion/storage unit 24 receives the corrected data 32 from the correction/storage unit 26. Firstly, the conversion/storage unit 24 performs as first data conversion processing 33 to resolve the corrected data 32 into pixels, and then, the resulting data is bit-mapped by rendering processing. Here, the bitmap data 34 subjected to bitmapping is stored in the conversion/storage unit 24. Next, the bitmap data 34 is transferred to a memory 35 for temporarily storing data. Next, the conversion/storage unit 24 performs geometric transformation (translation, rotation, scaling, and the like) or the like as second data conversion processing 36 to the transferred bitmap data 34. Next, the conversion/storage unit 24 converts the re-sampled bitmap data into a blanker data format 37 (ON/OFF (binary) bitmap data) as a command value to be transmitted to the blanking control circuit 21. Then, the main controller 20 finally transmits the blanker data format 37 to the blanking control circuit 21 to thereby cause perform writing.

Figure 4A:
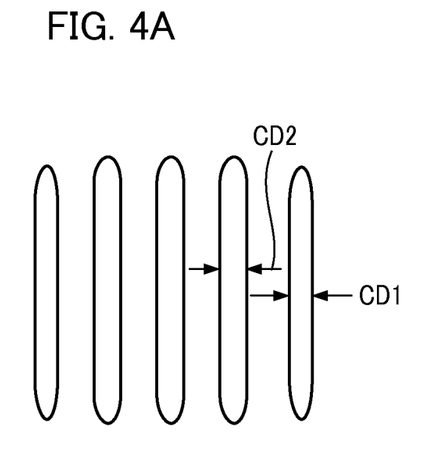
FIGS. 4A and 4B are diagrams illustrating the result of measuring a circuit pattern according to the first embodiment.
Figure 4B:
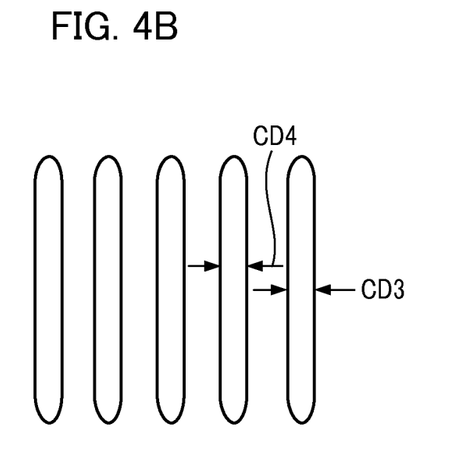

FIGS. 4A and 4B are diagrams illustrating the result of measuring a circuit pattern (resist pattern), which has been written on the wafer 6 based on the shape of the pattern data 30 as shown in FIG. 3, using an SEM (Scanning Electron Microscope). In particular, FIG. 4A is a diagram illustrating the result of measuring a circuit pattern (resist pattern) that has been writing by controlling the operation of the blanking deflector array 13 using the blanker data format 37 generated by the aforementioned flow. In looking at the writing result shown in FIG. 4A, it is found that the width CD1 of a pattern which is present at the region of the edge is narrower than the width CD2 of a pattern which is present at the region adjacent thereto. As described above, even when the pattern data 30 is subject to the proximity effect correction processing 31, a desired result may not be obtained by error factors of proximity effect correction, such as a material such as a resist, an antireflection film, or the like or changes in resist coating/development processing. Here, the expression "desired result may not be obtained" refers to, for example, the fact that the dimension or shape of a pattern is not within an allowable range. Accordingly, in such a case, the lithography apparatus 1 further performs the following processing so as to correct writing data. Hereinafter, a description will be given below on the assumption that the width CD1 shown in FIG. 4A is corrected so as to be closer to the width CD2.

Figure 5A:
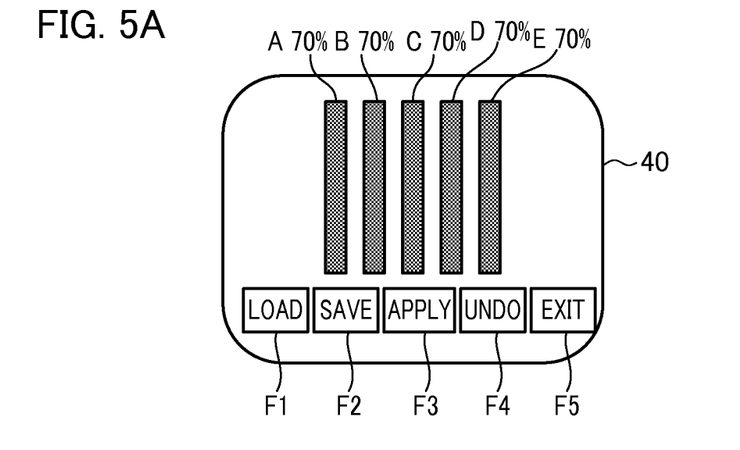
FIGS. 5A to 5C are diagrams illustrating screens upon changing a pixel value according to the first embodiment.
Figure 5B:
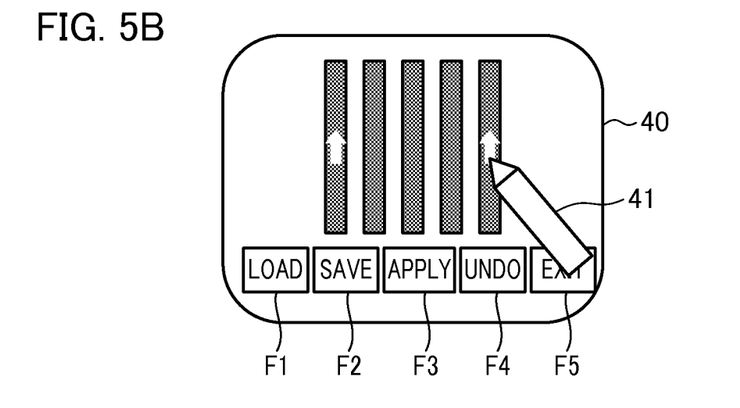
Figure 5C:
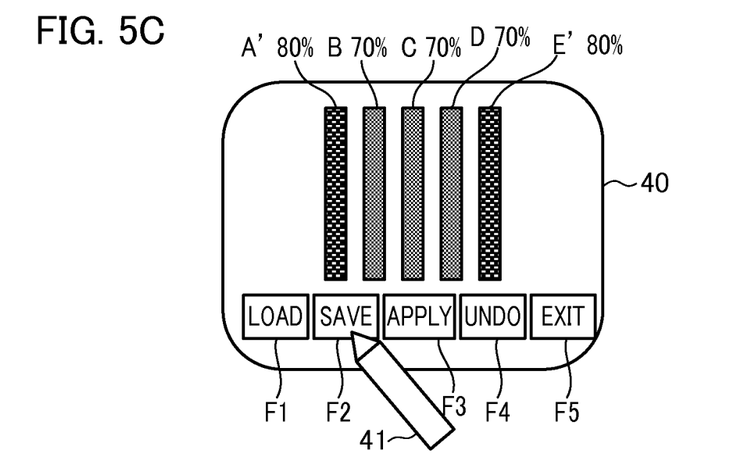

Firstly, the main controller 20 acquires current bitmap data 34 from the memory 35 and transfers the acquired bitmap data 34 to the writing data processing unit 25. Next, the writing data processing unit 25 causes the display unit 9 to display an image of the bitmap data 34. FIGS. 5A to 5C are schematic diagrams illustrating an editing screen 40 of the display unit 9 where the bitmap data 34 prior to editing, during editing, and after editing is displayed, respectively. FIG. 5A is a diagram illustrating the editing screen 40 on which the bitmap data 34 prior to editing (change) is being displayed. The editing screen 40 includes an editing region in which the bitmap data 34 corresponding to the shape of vector pattern data is displayed and function buttons F1 to F5 which are displayed, for example, at a region at the bottom of the editing region. The function button F1 is a "LOAD" button (icon) that is used to call the bitmap data 34 stored in the conversion/storage unit 24 so as to display bitmap data at any given position on the editing region. The function button F2 is a "SAVE" button that is used to store new bitmap data 34 edited on the editing region in the memory 35. The function button F3 is an "APPLY" button that is used to apply (reflect) the content of a change to other pattern graphics when there is a plurality of pattern graphics (image elements) having the same shape in bitmap data and one pattern graphic is changed. The function button F4 is an "UNDO" button that is used to undo content being edited. The function button F5 is an "EXIT" button that is used to end editing. Note that the functions, arrangement, and the number of these function buttons F1 to F5 are arbitrary and can be appropriately changed in accordance with the usage condition of a user.

Firstly, the bitmap data 34 being displayed on the editing region shown in FIG. 5A includes five pattern graphics including graphics A to E. At this time, assume that the bitmap pixel values of five graphics A to E are 70% (70% of the maximum value) which are the same as each other. Note that a bitmap pixel value can also be represented as concentration, gradation, or density of bitmap. A user of the lithography apparatus 1 confirms the writing result shown in FIG. 4A and determines that it is preferable to bring the width CD1 of the left and right patterns which are present at the regions of the edges closer to the width CD2 of the patterns which are present at the regions adjacent thereto. Next, in order to increase the width CD1, the user changes the pixel values for two regions, i.e., the graphics A and E from 70% to 80% that are different on the editing region. Here, a desired alteration amount (%) of a pixel value may be determined arbitrarily by the user in accordance with the previous editing result and the actual writing result. Alternatively, the correlation between the previous editing result and the actual writing result is stored in advance as a table in the conversion/storage unit 24 or the like and the writing data processing unit 25 appropriately refers to the correlation to thereby automatically determine a desired alteration amount of a pixel value. FIG. 5B is a diagram illustrating the editing screen 40 on which bitmap data being edited is being displayed. A user directly touches the pattern graphics being displayed on the editing region with his/her finger, a touch pen 41, or the like so that the pixel value of the portion can be changed to a desired value. For example, a user traces the region (here, the graphics A and E) for which the pixel value is desired to be changed with his/her finger from below upward as shown by the arrows in FIG. 5B so that the pixel value can be increased. At this time, it is preferable that the setting is made on the display unit 9 (or the writing data processing unit 25) such that the pixel value is increased, for example, by 5% per tracing operation. Furthermore, it is preferable that the setting is made on the editing screen 40 such that an increase in pixel value can be distinguished (recognized) by, for example, gray level or color for pattern graphics. In this example, a user traces the surfaces of the graphics A and E being displayed on the editing region two times from below upward so that the pixel values can be increased by 10% (i.e. can be changed to 80%). In contrast, a user may also want to decrease a pixel value. In this case, a user traces the surface of a graphic for which the pixel value is desired to be decreased on the editing region with his/her finger from above downward. FIG. 5C is a diagram illustrating the editing screen 40 on which bitmap data after editing is being displayed. Since the graphics A and E for which the pixel values have been changed by a user are displayed deeper than other graphics on the editing screen 40, a user readily recognizes the changes in pixel value. Then, when a user touches the function "SAVE" button F2, the edited bitmap data 34 is stored in and reflected to the memory 35 via the writing data processing unit 25 and the main controller 20 to thereby be updated as the new bitmap data 34.

Then, the main controller 20 causes the conversion/storage unit 24 to perform the second data conversion processing 36 for the updated the bitmap data 34 so as to convert it into the blanker data format 37 in the same manner as described above. After that, the main controller 20 transmits the blanker data format 37 to the blanking control circuit 21 to thereby cause the blanking control circuit 21 to perform writing. FIG. 4B is a diagram illustrating the result of writing by controlling the operation of the blanking deflector array 13 using the blanker data format 37 generated based on the updated bitmap data 34. In looking at the writing result shown in FIG. 4B, it is found that the width CD3 of a pattern which is present at the region of the edge has been adjusted to be substantially the same as the width CD4 of a pattern which is present at the region adjacent thereto.

As described above, when the shape of a circuit pattern to be written is desired to be changed despite the fact that the lithography apparatus 1 has performed writing based on the pattern data 30 subjected to the proximity effect correction processing 31, writing data (the bitmap data 34) can be edited within the lithography apparatus 1. In other words, when the shape of a circuit pattern to be written is desired to be changed, the pattern data 30 stored in an external correction/storage unit 26 needs to be subject to another proximity effect correction processing 31 and the resulting data needs to be re-acquired by the conventional lithography apparatus. However, in the present embodiment, such data reacquisition becomes unnecessary. Thus, after updating the bitmap data 34, the lithography apparatus 1 can immediately resume writing, resulting in a considerable reduction in time between editing and re-writing of writing data.

When it is determined that the result of updating the bitmap data 34 is within an allowable range, the main controller 20 reflects the new bitmap data 34 temporarily stored in the memory 35 to bitmap data accumulated in the conversion/storage unit 24. In this manner, the lithography apparatus 1 can obtain the writing result rapidly again by using the new bitmap data 34 so that the time of reediting can be omitted. Furthermore, the updated bitmap data 34 may also be reflected to the original pattern data 30. In this case, the conversion/storage unit 24 performs inverse transformation, i.e., third data conversion processing (conversion unit) 38 for converting the updated new bitmap data 34 into vector pattern data, and then stores the converted pattern data in the correction/storage unit 26. In this manner, the pattern data 30 corresponding to the bitmap data 34 updated in the lithography apparatus 1 can be shared with the lithography apparatus 1 and other devices (systems). Note that processing for storing data subjected to the third data conversion processing 38 may be carried out at any given timing, the effects on time between editing and re-writing of the writing data can be reduced.

As described above, according to the present embodiment, a lithography apparatus that is advantageous for readily performing proximity effect correction without the intermediary of changes in obtained vector pattern data may be provided.

(Second Embodiment)

Figure 6A:
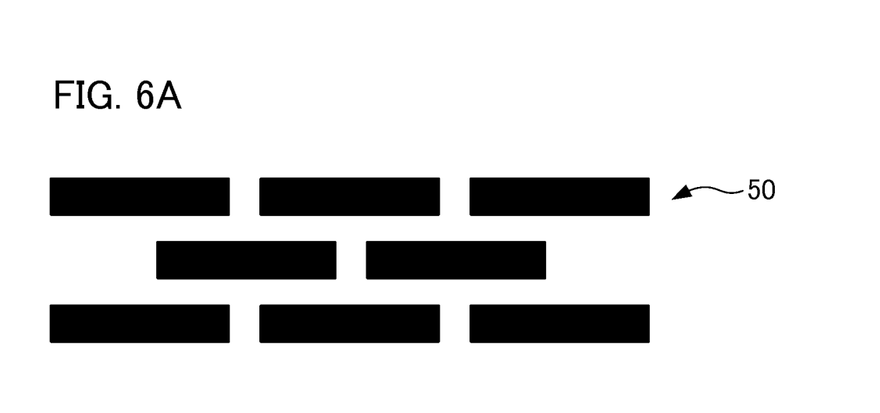
FIGS. 6A to 6C are diagrams illustrating vector pattern data or the like assumed in a second embodiment.
Figure 6B:
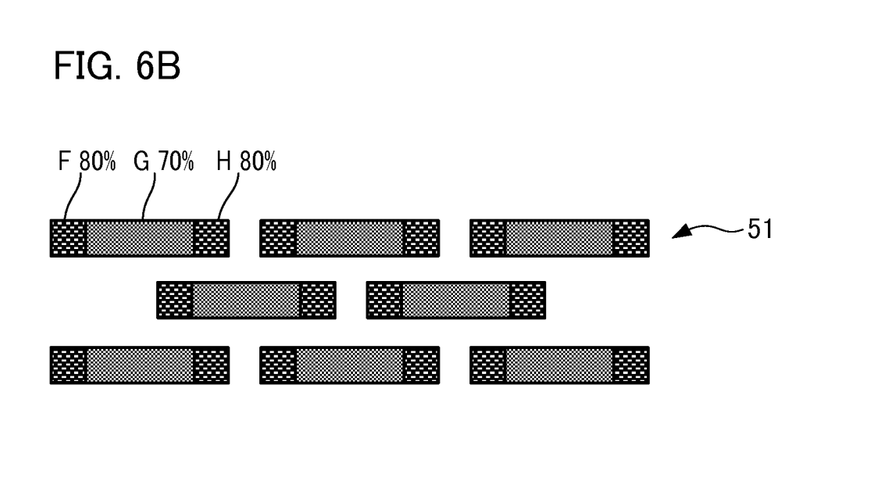
Figure 6C:
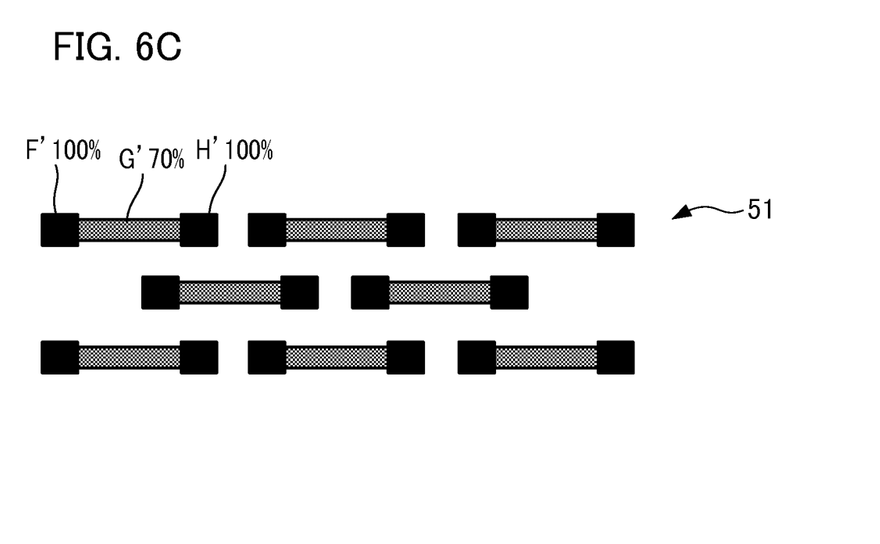

Next, a description will be given of a lithography apparatus according to a second embodiment of the present invention. A feature of the lithography apparatus of the present embodiment lies in that one pattern graphic is divided for operation. FIGS. 6A to 6C are diagrams illustrating pattern data 50 (corresponding to the pattern data 30 of the first embodiment) of the present embodiment and bitmap data 51 (corresponding to the bitmap data 34 of the first embodiment) corresponding to the pattern data 50. In the present embodiment, components corresponding to those in the lithography apparatus 1 of the first embodiment are designated by the same reference numerals, and therefore, its explanation will be omitted. Firstly, FIG. 6A is a diagram illustrating the pattern data 50 which is applied to the present embodiment as an example. The pattern data 50 is a collection of rectangular pattern graphics, where a plurality of pattern graphics having the same shape is arranged in a staggered pattern. FIG. 6B is a diagram illustrating the bitmap data 51 that has been subject to the proximity effect correction processing 31 and the first data conversion processing 33 shown in FIG. 2 and that is stored in the memory 35. One pattern graphic in the bitmap data 51 is divided into three regions, i.e., graphics F, G, and H in the longitudinal direction and each graphic has been subject to the proximity effect correction processing 31. In this case, the bitmap pixel values for the graphics F, G, and H are set to 80%, 70%, and 80%, respectively. FIG. 6C is a diagram illustrating the bitmap data 51 to which the target pixel values and shapes have been reflected by the following editing operation.

Figure 7A:
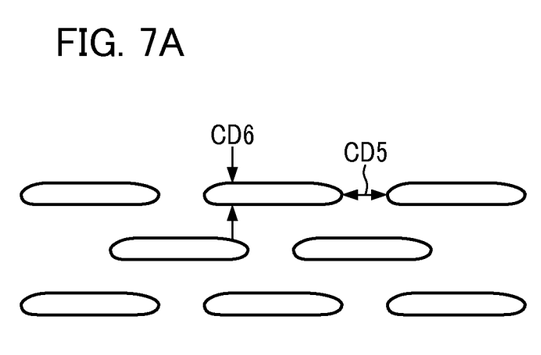
FIGS. 7A and 7B are diagrams illustrating the result of measuring a circuit pattern according to the second embodiment.
Figure 7B:
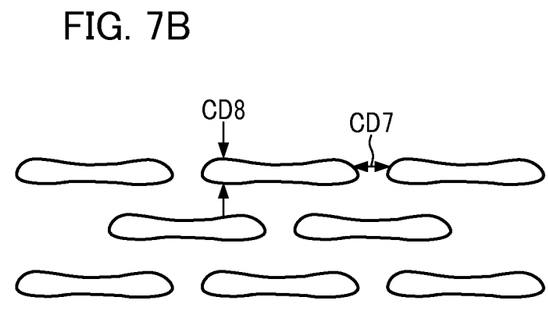

FIGS. 7A and 7B are diagrams illustrating the result of measuring a circuit pattern, which has been written on the wafer 6 based on the pattern data 50 having the shape as shown in FIG. 6A, using SEM. In particular, FIG. 7A is a diagram illustrating the result of writing by controlling the operation of the blanking deflector array 13 using the blanker data format 37 without updating bitmap data in the lithography apparatus 1. A user of the lithography apparatus 1 confirms the writing result shown in FIG. 7A and determines that it is preferable to narrow the spacing CD5 between the patterns and increase the width CD6 which is present at the edge of the pattern. Next, in order to deform the pattern in a desired shape as described above, the user changes the pixel values for two graphics F and H, for example, from 80% to 100% that are different on the editing region. On the other hand, the user does not change the pixel value for the remaining graphic G.

Figure 8A:
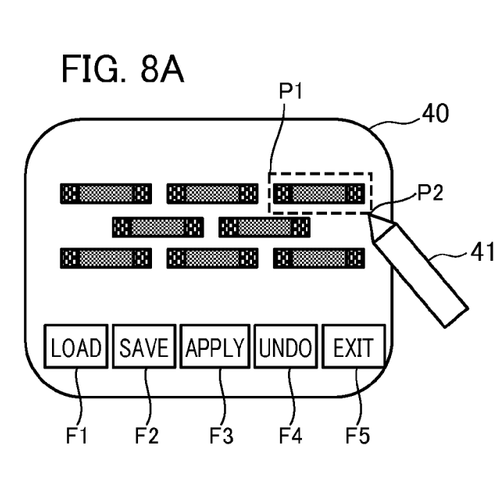
FIGS. 8A to 8D are diagrams illustrating screens upon changing a pixel value according to the second embodiment.
Figure 8B:
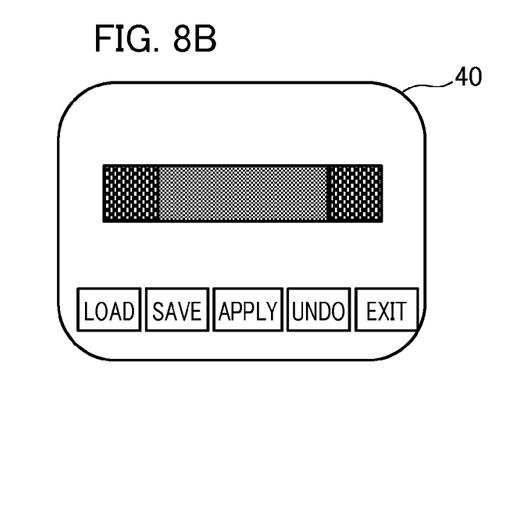
Figure 8C:
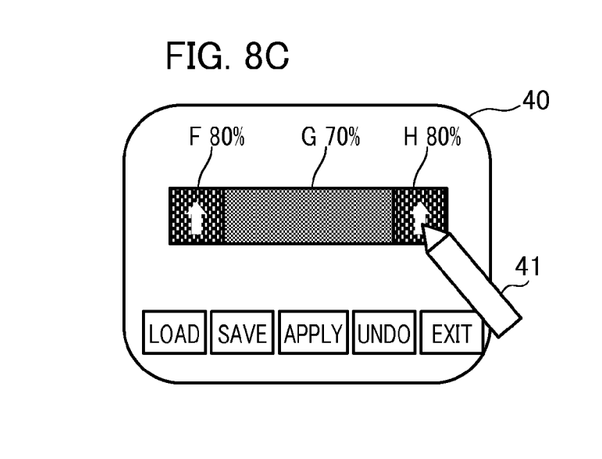
Figure 8D:
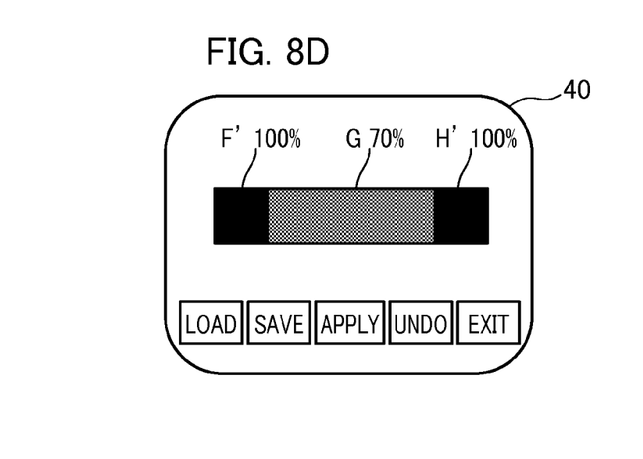

FIGS. 8A to 8D are schematic diagrams illustrating the editing screen 40 displayed on the display unit 9, where an image of the bitmap data 51 during editing or after editing is being displayed in the present embodiment. In particular, FIG. 8A is a diagram illustrating the editing screen 40 on which the entire bitmap data 51 is being displayed at the start of editing. Firstly, a user selects a pattern graphic desired to be changed from among the bitmap data 51 displayed on the editing region of the editing screen 40 so as to enlarge the display of the selected pattern graphic. In order to enlarge the display of only a specific graphic on the editing region, a user may trace the spacing between a start point P1 and an end point P2 with the touch pen 41 or the like such that the graphic on the editing region falls within the enlargement range as shown in FIG. 8A. FIG. 8B is a diagram illustrating the editing screen 40 on which a pattern graphic enlarged by the selection of the enlargement range shown in FIG. 8A is being displayed. FIG. 8C is a diagram illustrating the editing screen 40 on which a pattern graphic being edited from among the bitmap data 51 is being displayed. As in the first embodiment, a user directly touches the pattern graphics being displayed on the editing region with his/her finger, the touch pen 41, or the like so that the pixel value of the portion can be changed to a desired value. For example, a user traces the graphics (here, the graphics F and H) for which the pixel value is desired to be changed with his/her finger from below upward as shown by the arrows in FIG. 8C so that the number of pixels can be increased. In this case, when the setting is made on the display unit 9 such that the pixel value is increased, for example, by 5% per tracing operation, a user traces the surfaces of the graphics F and H being displayed on the editing region four times from below upward so that the pixel values for the graphics F and H can be increased by 20% (i.e. can be changed to 100%). FIG. 8D is a diagram illustrating the editing screen 40 on which the edited pattern graphic from among the bitmap data 51 is being displayed. Also, in this case, the graphics F and H for which the pixel values have been changed by a user are displayed deeper than other graphics on the editing screen 40.

Figure 9A:
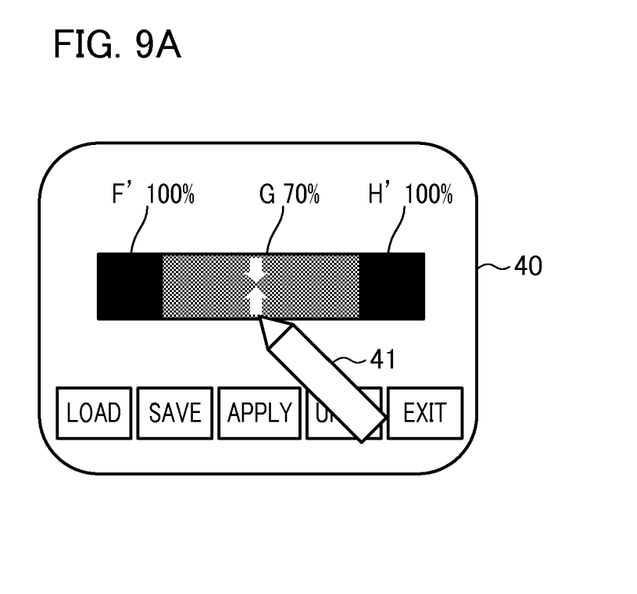
FIGS. 9A and 9B are diagrams illustrating screens upon directly changing graphics according to the second embodiment.
Figure 9B:
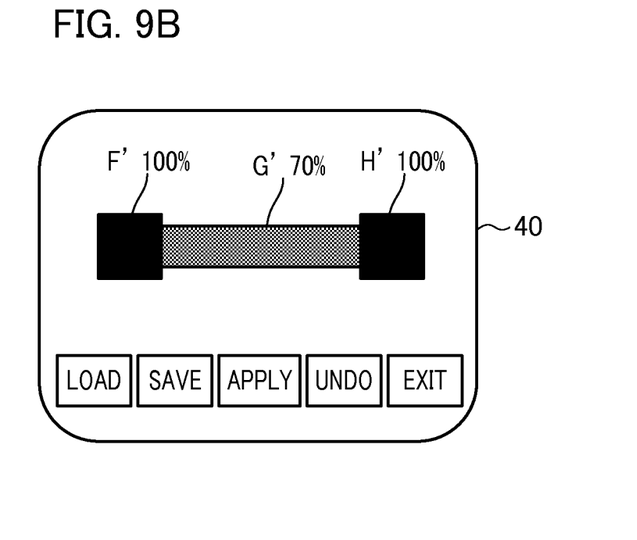
Figure 10A:
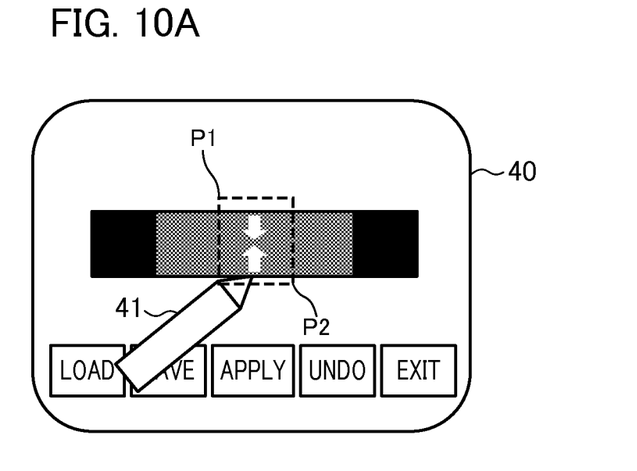
FIGS. 10A and 10B are diagrams illustrating screens upon deforming a part of graphics according to the second embodiment.

The aforementioned description has been given of changing a pixel value for a pattern graphic. In contrast, not only the pixel value for a pattern graphic but also at least one of the dimension and shape of a pattern graphic (the bitmap data 51) can also be changed (may also generally be referred to as "deformation") on the editing screen 40 displayed on the display unit 9. Hereinafter, a description will be given of editing by which a user deforms a pattern graphic on the editing screen 40. FIGS. 9A and 9B are schematic diagrams illustrating the editing screen 40 on which pattern graphics during editing and after editing are being displayed when the pattern graphics are directly deformed in the present embodiment. In particular, FIG. 9A is a diagram illustrating the editing screen 40 with the pattern graphic for which the pixel value has been changed as described with reference to FIGS. 8A to 8D being edited. Here, when a user wants to narrow the width of the graphic G in the lateral direction, the user moves his/her finger, the touch pen 41, or the like in the direction of the arrow shown in FIG. 9A while specifying the "side" of the graphic G being displayed on the editing region with his/her finger, the touch pen 41, or the like, so that the graphic G can be deformed into a desired shape. FIG. 9B is a diagram illustrating the editing screen 40 on which the pattern graphic after editing as shown in FIG. 9A is being displayed. Here, the pixel value is intended to be held as it is during deformation. Furthermore, in the case of pattern graphic deformation, a pattern graphic may be deformed entirely or only a partial region of a pattern graphic may also be deformed. FIGS. 10A and 10B are schematic diagrams illustrating the editing screen 40 on which pattern graphics during editing or after editing are being displayed when a partial region of a pattern graphic is deformed in the present embodiment. In particular, FIG. 10A is a diagram illustrating the editing screen 40 with the pattern graphic for which the pixel value has been changed as described with reference to FIG. 8 being edited. Here, when a user wants to narrow only the width of the center portion of the graphic G, the user firstly traces the spacing between the start point P1 and the end point P2 with the touch pen 41 or the like such that the specific region on the editing region falls within the deformation range. Then, the user moves the side within the selected deformation range in the direction of the arrow shown in FIG. 10A, so that the specific portion of the graphic G can be deformed into a desired shape.

Figure 10B:
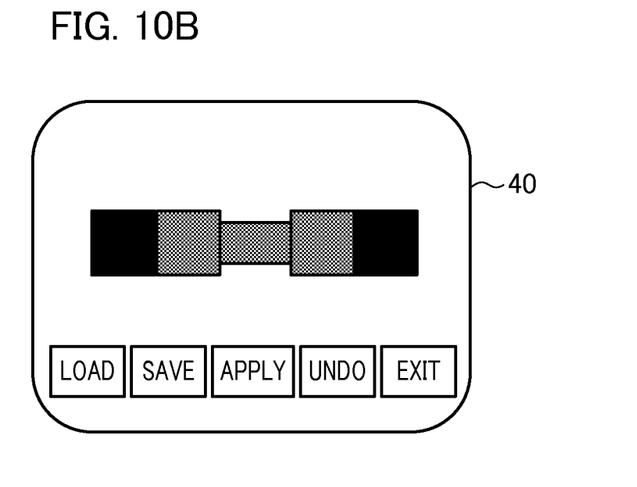

FIG. 10B is a diagram illustrating the editing screen 40 on which the pattern graphic after editing as shown in FIG. 10A is being displayed.

Figure 11A:
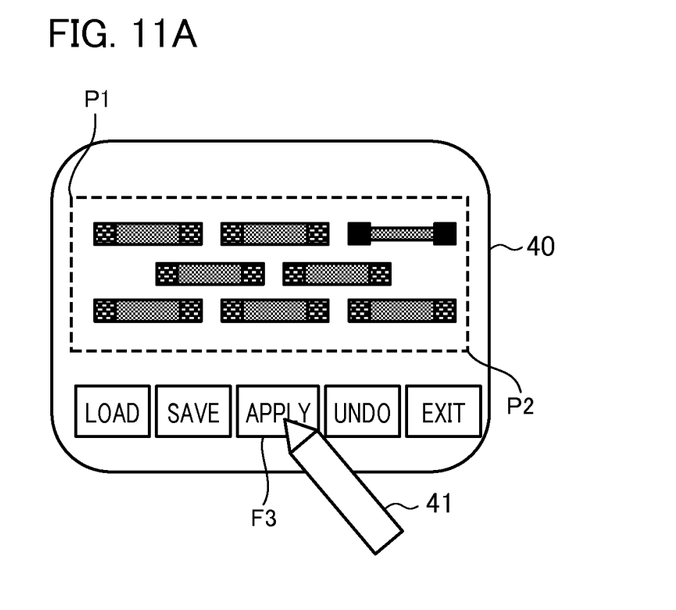
FIGS. 11A and 11B are diagrams illustrating screens upon reflecting a graphical state to other graphics according to the second embodiment.
Figure 11B:
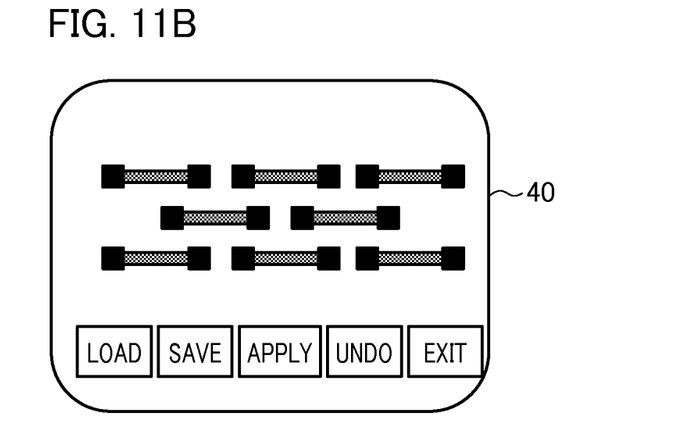

In the description from FIG. 8A to FIG. 10B, one pattern graphic constituting the bitmap data 51 is edited. Next, a description will be given of a method for reflecting the pixel value, shape, or the like of the edited pattern graphic to a plurality of other separated pattern graphics having the same shape. FIGS. 11A and 11B are schematic diagrams illustrating the editing screen 40 when the state of the edited pattern graphic is reflected to other pattern graphics having the same shape. In particular, FIG. 11A is a diagram illustrating the editing screen 40 with the graphical state being reflected to other pattern graphics. Firstly, a user reduces the screen on the editing region after editing as shown in FIG. 8D, FIG. 9B, or FIG. 10B, the entire original bitmap data 51 appears on the editing region. In this state, only a pattern graphic at topmost right has been changed. Next, a user traces the spacing between the start point P1 and the end point P2 with the touch pen 41 or the like such that a portion in which the same pattern graphic is repeated on the editing region falls within the selection range. On the editing screen 40, the pattern graphics within the selection range are highlighted in the sense that the pattern graphics have been selected. Then, a user touches the function "APPLY" button F3 so that the state of one edited pattern graphic is totally applied to other pattern graphics having the same shape. FIG. 11B is a diagram illustrating the editing screen 40 on which the pattern graphics (the bitmap data 51) subjected to total application are being displayed. Then, when a user touches the function "SAVE" button F2, the edited bitmap data 51 is stored in and reflected to the memory 35 via the writing data processing unit 25 and the main controller 20 to thereby be updated as new bitmap data 51.

FIG. 7B is a diagram illustrating the result of writing by controlling the operation of the blanking deflector array 13 using the blanker data format 37 generated based on the updated bitmap data 51 in the present embodiment. In looking at the writing result shown in FIG. 7B, the spacing CD5 between patterns is narrowed down to the spacing CD7 and the width CD6 at the edge of the pattern is increased to the width CD8. In other words, it is found that the original spacing CD5 between patterns and the original width CD6 at the edge of the pattern have been adjusted as desired (within an allowable range). As described above, according to the present embodiment, a lithography apparatus that is advantageous for readily performing proximity effect correction without the intermediary of changes in obtained vector pattern data may be provided.

(Article Manufacturing Method)

An article manufacturing method according to an embodiment of the present invention is preferred in manufacturing an article, for example, a micro device such as a semiconductor device or the like or an article such as an (optical) element or the like having a microstructure. The article manufacturing method may include a step of forming a latent image pattern on a substrate, on which a photosensitive material is coated, using the aforementioned lithography apparatus (a step of writing a pattern on a substrate); and a step of developing the substrate on which the latent image pattern has been formed in the previous step. Furthermore, the article manufacturing method may include other known steps (oxidizing, film forming, vapor depositing, doping, flattening, etching, resist peeling, dicing, bonding, packaging, and the like). The article manufacturing method of the present embodiment has an advantage, as compared with a conventional article manufacturing method, in at least one of performance, quality, productivity and production cost of an article.

While the embodiments of the present invention have been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-188624 filed on Aug. 29, 2012 which is hereby incorporated by reference herein in its entirety.

What is claimed is:

1. A lithography apparatus that converts vector pattern data into bitmap data, the lithography apparatus comprising:
    a display unit including a touch panel function;
    a processing unit that causes the display unit to display a bitmap image for lithography and performs processing for updating the bitmap data by changing at least one of a pixel value, dimension, and shape of the bitmap image displayed on the display unit based on an input received via the display unit; and
    a control unit configured to control writing on a substrate with a charged particle beam based on the updated bitmap data updated by the processing unit.

2. The lithography apparatus according to claim 1, wherein the processing unit is configured to change a pixel value, which varies depending on the region of the image, of the bitmap image displayed on the display unit based on the input received via the display unit.

3. The lithography apparatus according to claim 1, wherein the processing unit is configured to change at least one of dimension and shape, which varies depending on the region of the bitmap image, of the bitmap image displayed on the display unit based on the input received via the display unit.

4. The lithography apparatus according to claim 2, wherein the processing unit is configured to change at least one of dimension and shape, which varies depending on the region of the bitmap image, of the bitmap image displayed on the display unit based on the input received via the display unit.

5. The lithography apparatus according to claim 1, wherein, when the bitmap image displayed on the display unit includes a plurality of bitmap image elements which are identically separated, the processing unit is configured to perform processing for updating the bitmap data by performing changes made to one of the plurality of bitmap image elements to at least one other of the plurality of bitmap image elements.

6. The lithography apparatus according to claim 1, further comprising:
    a conversion unit configured to convert the bitmap data updated by the processing unit into vector pattern data.

7. A method for manufacturing an article, the method comprising:
    writing on a substrate with a lithography apparatus;
    and developing the substrate on which the writing has been performed,
    wherein the lithography apparatus is a lithography apparatus that converts vector pattern data into bitmap data, the lithography apparatus comprising:
    a display unit including a touch panel function;
    a processing unit that causes the display unit to display a bitmap image for lithography and performs processing for updating the bitmap data by changing at least one of a pixel value, dimension, and shape of the bitmap image displayed on the display unit based on an input received via the display unit; and
    a control unit configured to control writing on a substrate with a charged particle beam based on the updated bitmap data updated by the processing unit.

8. The lithography apparatus according to claim 2, wherein the processing unit is configured to change the pixel value, depending on a region of the image touched by a touch instrument, of the bitmap image displayed on the display unit.

9. The lithography apparatus according to claim 8, wherein the processing unit is configured to determine whether to increase the pixel value or decrease the pixel value depending on a direction of the touch by the touch instrument.

10. The lithography apparatus according to claim 8, wherein the processing unit is configured to determine an alteration amount of the pixel value depending on the number of touches of the touch instrument.

11. The lithography apparatus according to claim 6, wherein the conversion unit is further configured to store the converted bitmap data in a storage unit which is provided on the exterior of the lithography apparatus.

* * * * *